United States Patent [19]

Armendariz

[11] Patent Number: 5,306,162

[45] Date of Patent: Apr. 26, 1994

[54] CLAMP CONNECTOR APPARATUS FOR REMOVABLY COUPLING A FLEXIBLE RIBBON CABLE TO A PRINTED CIRCUIT BOARD

[75] Inventor: Luis C. Armendariz, Houston, Tex.

[73] Assignee: Compaq Computer Corporation, Houston, Tex.

[21] Appl. No.: 47,227

[22] Filed: Apr. 14, 1993

[51] Int. Cl.⁵ ............................................. H01R 9/09
[52] U.S. Cl. .................................... 439/67; 439/493
[58] Field of Search ........................ 439/67, 77, 493

[56] References Cited

U.S. PATENT DOCUMENTS

| | | | |
|---|---|---|---|
| 4,420,206 | 12/1983 | Martyniak | 439/67 |
| 4,538,865 | 9/1985 | Wakabayashi | 439/67 |
| 4,934,942 | 6/1990 | Casciotti | 439/493 |
| 5,197,890 | 3/1993 | Seymour | 439/77 |

FOREIGN PATENT DOCUMENTS 73528  3/1983  European Pat. Off. .............. 439/67

*Primary Examiner*—Neil Abrams
*Attorney, Agent, or Firm*—Konneker Bush & Hitt

[57] ABSTRACT

An end of a flexible ribbon cable is clamped to a side of a printed circuit board, and operatively coupled to electrically conductive surface traces thereon in a parallel relationship with the circuit board, using a molded plastic snap connector that carries an elastomeric member which resiliently bears against the cable end and presses it against the circuit board side. The connector member is provided with alignment pins which extend through corresponding holes in the cable end and the circuit board and function to precisely and automatically align the cable and board traces being operatively coupled, and snap tab portion which extend through holes in the cable end and circuit board and resiliently clip onto the board to maintain the elastomeric member in compression against the cable end portion. The alignment pins and the snap tab portions may alternatively be formed on a wall portion of a computer housing in which the printed circuit board is operatively disposed.

12 Claims, 1 Drawing Sheet

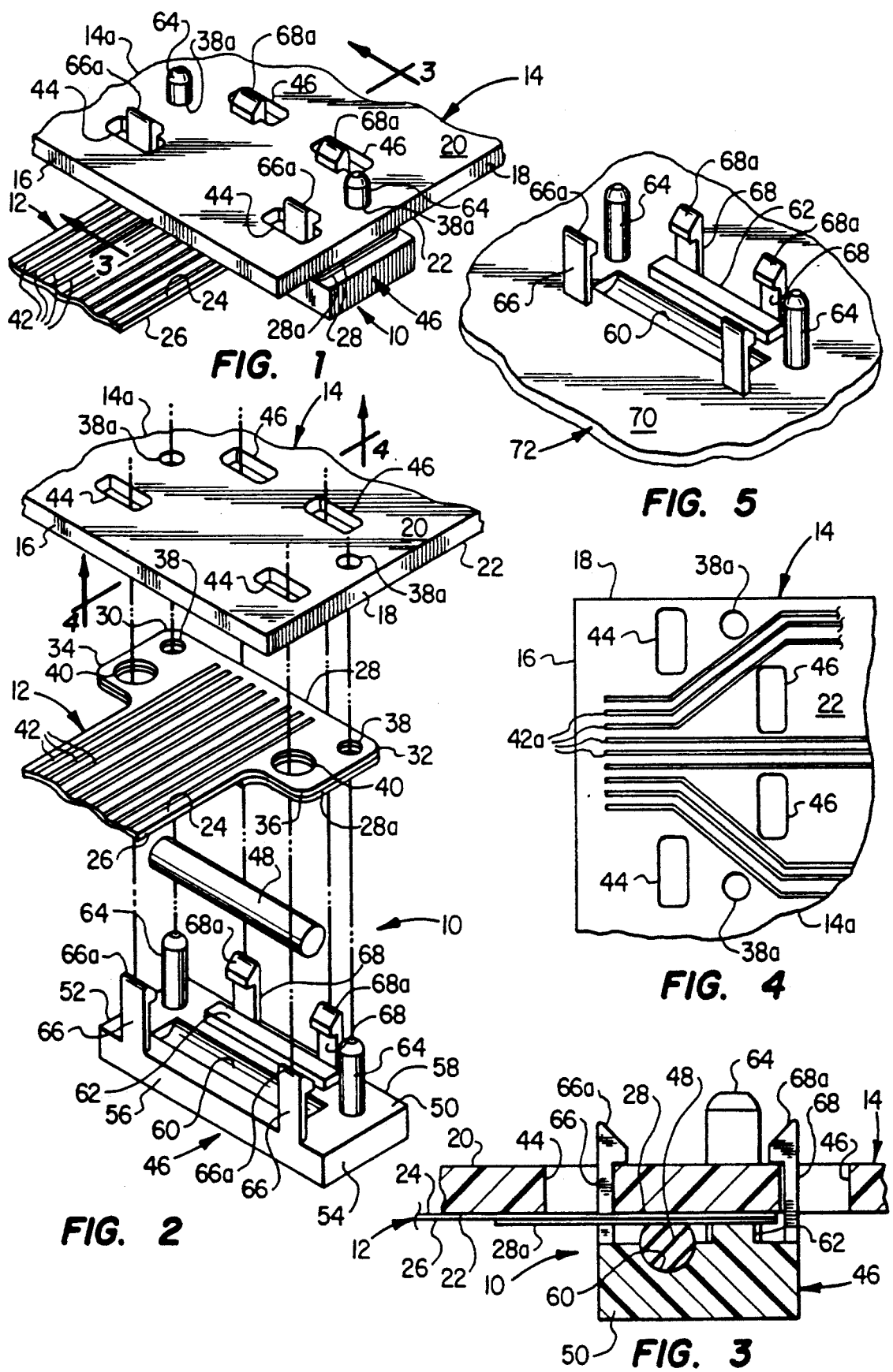

CLAMP CONNECTOR APPARATUS FOR REMOVABLY COUPLING A FLEXIBLE RIBBON CABLE TO A PRINTED CIRCUIT BOARD

BACKGROUND OF THE INVENTION

1. Field of the Invention

The present invention generally relates to printed circuit board apparatus, and more particularly relates to connector apparatus used to operatively couple flexible ribbon cables to printed circuit boards in, for example, computers.

2. Description of Related Art

In computer applications, as well as a variety of other applications, it is often necessary to connect one or more flexible ribbon cables to a printed circuit board in order to transmit electrical signals to and/or receive electrical signals from the printed circuitry on the board. A flexible ribbon cable is typically formed from a flexible, electrically insulative film material, such as mylar, having a spaced series of electrically conductive traces formed on a side surface thereof. Under conventional practice, these traces are customarily coupled to corresponding traces on a side surface of a rigid circuit board using one of two types of connector structures—a "zero insertion force" connector or a "low insertion force" connector.

Using the zero insertion force connector, the board connection end of the flexible ribbon cable is slipped into a slot formed in a removable connector body which is then mated with a corresponding connector structure fixedly secured to a side of the rigid circuit board and operatively connected to its surface trace circuitry. The mating of the removable connector body with its associated fixed connector structure closes the connector body slot in a manner clamping the board connection end of the flexible ribbon cable therein and operatively coupling the ribbon cable to the circuit board. Subsequent disconnection of the ribbon cable from the circuit board is achieved by disconnecting the removable connector body from its associated fixed connector structure. This automatically causes the connector body slot to widen, thereby unclamping the ribbon cable connector end and permitting it to be slipped out of the connector body slot.

In the low insertion force connector the board connection end of the ribbon cable is manually plugged into a suitable slot-shaped socket formed in a connector structure mounted on the circuit board. Insertion of the board connection end of the ribbon cable into this slot slidably and removably engages electrically conductive surface traces on the ribbon end with corresponding contact portions within the connector structure. Subsequent disconnection of the ribbon cable from the circuit board is achieved simply by pulling the ribbon cable connector end out of the connector structure slot.

Both of these conventional ribbon cable connector structures are subject to a variety of well known problems, limitations and disadvantages. For example, over time and repeated connections and disconnection of the ribbon cable thereto, they each tend to undesirably crease and crack the surface traces on the board connector end of the ribbon cable. Additionally, the low insertion force connector structure tends, through friction, to at least partially wipe away end portions of the cable surface traces after repeated insertions therein and removal therefrom of the board connector end of the ribbon cable.

In addition to potentially damaging end portions of the ribbon cable which they couple to their associated circuit board, these conventional ribbon cable connector structures have a tendency to create undesirable misalignments between their internal contact areas and the traces on the received ribbon cable connector end due to the manufaturing process variations when the cable is printed and cut. Moreover, these types of connector structures are typically manufactured only with an industry standard pitch spacing of, for example, 1 mm, 0.100", etc. Accordingly, the board connection end of a given ribbon cable to be used with one of these conventional connector structures must have, as to its surface traces, an identical pitch spacing. An often desirable larger pitch spacing in the ribbon cable board connection end, which would tend to lessen potential misalignment problems, typically cannot be accommodated by these conventional types of connector structures.

It can be readily be seen from the foregoing that it would be highly desirable to provide improved apparatus for coupling flexible cables to printed circuit boards in a manner eliminating or at least substantially reducing the above-mentioned problems, limitations and disadvantages associated with conventional connector structures of the type generally described above. It is accordingly an object of the present invention to provide such improved apparatus.

SUMMARY OF THE INVENTION

In carrying out principles of the present invention, in accordance with a preferred embodiment thereof, specially designed clamp connector apparatus is provided for removably coupling an end portion of a flexible ribbon cable having a first spaced series of electrically conductive traces on a side surface thereof to a side surface of a printed circuit board having a second spaced series of electrically conductive traces formed thereon and alignable with the first series of electrically conductive traces.

The clamp connector apparatus comprises a support structure and an elastomeric member carried on the support structure and projecting outwardly therefrom. Attachment means are provided for removably securing the support structure to the printed circuit board in a spaced apart, facing relationship with the aforementioned side surface thereof, with the ribbon cable end portion being interposed between the elastomeric member and the circuit board side surface, and the side surfaces of the ribbon cable end portion and the printed circuit board being positioned against one another, in a manner compressing the elastomeric member against the ribbon cable end portion.

A spaced plurality of openings are formed through the ribbon cable end portion. These openings receive cooperating alignment means associated with the circuit board and the support structure and operative to maintain the first and second series of electrically conductive traces in precisely aligned contact with one another at the location of the compressed elastomeric member.

The attachment means preferably comprise outwardly projecting resilient snap tab portions formed on the support structure, received in corresponding openings in the printed circuit board, and releasably locked to the circuit board. The cooperating alignment means preferably comprise outwardly projecting alignment pin portions formed on the support structure and extending through the cable end portion openings and into aligned openings formed in the printed circuit board.

The elastomeric member is preferably of a cylindrical configuration and has a side portion complementarily received in an elongated groove formed in a side surface of the support structure and extending transversely to the first and second series of electrically conductive traces. Positioned beside the groove, in a spaced apart parallel relationship therewith, is an elongated stabilizing portion formed on the support structure side surface and bearing against the cable end portion.

In one embodiment thereof the support structure is a molded plastic snap connector member having the snap tab portions, alignment pin portions, groove and stabilizing portion molded integrally therewith. In another embodiment of the invention, the printed circuit board and cable end portion are disposed within a computer housing, and the support structure is defined by a wall portion of the housing having the snap tab portions, alignment pin portions, groove and stabilizing portion formed thereon.

BRIEF DESCRIPTION OF THE DRAWINGS

FIG. 1 is a perspective view of a portion of a representative printed circuit board having a flexible ribbon cable operatively coupled thereto using specially designed clamp connector apparatus embodying principles of the present invention;

FIG. 2 is an exploded perspective view of the circuit board portion, flexible ribbon cable and clamp connector apparatus;

FIG. 3 is an enlarged scale cross-sectional view through the circuit board, ribbon cable and clamp connector apparatus taken along line 3—3 of FIG. 1;

FIG. 4 is a bottom plan view of the printed circuit board portion taken along line 4—4 of FIG. 2; and FIG. 5 is a perspective view of a specially configured wall portion of a computer housing used in place of the snap connector member shown in FIGS. 1-3.

DETAILED DESCRIPTION

Referring initially to FIGS. 1, 2 and 4, the present invention provides improved connector apparatus 10 for removably and operatively coupling a flexible ribbon cable 12 to a portion 14a of a printed circuit board 14, representatively a printed circuit board operatively disposed within the housing (not illustrated in FIGS. 1, 2 and 4) of a personal computer. The portion 14a of the circuit board 14 is representatively a corner portion thereof, disposed adjacent the juncture of perpendicular board side edges 16 and 18, and has top and bottom sides 20 and 22. The connector apparatus 10, however, could also be used to operatively couple the ribbon cable 12 to any other desired portion of the circuit board 14.

Ribbon cable 12 is of an elongated rectangular configuration, is conventionally formed from a suitable flexible, electrically insulative film material such as mylar for circuits with printed silver inks or polyimide film for etched copper circuits, and has top and bottom side surfaces 24,26. The cable is provided with a laterally enlarged, generally T-shaped board connector end portion 28 having outer side corners 30,32 and inner side corners 34,36 (see FIG. 2). An additional layer of flexible film 28a is suitably secured to the underside of the end portion 28 and serves to thicken and stiffen it.

For purposes later described, a pair of circular alignment holes 38 are formed through the cable end portion 28 adjacent its front side corners 30 and 32, and a pair of larger diameter circular access holes 40 are formed through the cable end portion 28 adjacent its inner side corners 34 and 36. Longitudinally extending along the top side surface 24 of the ribbon cable 12, and onto the top side of its end portion 28, are a mutually spaced, parallel series of electrically conductive surface traces 42. In a manner subsequently described, the connector apparatus 10 is used to releasably couple right end portions of these traces 42 to left end portions of corresponding electrically conductive traces 42a (see FIG. 4) formed on the bottom side 22 of the printed circuit board portion 14a. To effect this releasable trace coupling, the connector apparatus clamps the cable end portion 28, top side up, to the bottom side 22 of the circuit board portion 14a.

With the cable end portion 28 in this operatively clamped orientation, its alignment holes 38 underlie and register with circular alignment holes 38a formed in the circuit board portion 14a, and its access holes 40 underlie elongated openings 44 formed in the circuit board portion 14a. The board openings 38a are positioned generally between the elongated board openings 44 and another pair of elongated openings 46 formed through the circuit board portion 14a.

As best illustrated in FIG. 2, the connector apparatus 10 includes a molded plastic snap connector member 46, and an elastomeric clamping member 48 having an elongated cylindrical configuration and being formed from a suitable low compression memory material such as rubber, neoprene or, as illustrated, a resilient cushioning material manufactured and sold under the trade name "Poron" by the Rogers Corporation of Rogers, Conn.

Snap connector member 46 has an elongated rectangular body 50 having opposite end edge portions 52,54 and opposite side edge portions 56,58. An elongated groove 60 is formed in the top side of the body 50 and longitudinally extends parallel to its length, the groove having a generally semicircular cross-section along its length. For purposes later described, the length and width of the groove 60 are sized in a manner such that a lower side portion of the resilient clamping member 48 may be complementarily received therein.

Positioned between the groove 60 and the side edge 58 of the body 50, and extending parallel to the groove 60, is an elongated rectangular stabilizing portion 62 projecting upwardly from the top side of the body 50. Spaced apart from the opposite ends of the stabilizing projection 62, and extending upwardly from the top side of the body 50, are a pair of cylindrical alignment pins 64 spaced apart and sized to be complementarily received in the circular holes 38,38a in the ribbon cable end portion 28 and the circuit board portion 14a as subsequently described.

A spaced pair of snap tab portions 66 project upwardly from the body side edge portion 56 and have barbed upper ends 66a. In a similar manner a spaced pair of snap tab portions 68 project upwardly from the body side edge portion 58 and have barbed upper ends 68a. The tabs 66 are spaced in a manner permitting them to be extended upwardly through the access holes 40 in the ribbon cable end portion 28 and the elongated openings 44 in the circuit board portion 14a, and the tabs 68 are spaced in a manner permitting them to be extended upwardly through the elongated openings 46 in the circuit board portion 14a.

To operatively clamp the ribbon cable end portion 28 to the bottom side 22 of the circuit board portion 14a, the cylindrical clamping member 48 is first inserted into the snap connector member body groove 60. With the top side 24 of the ribbon cable 12 facing upwardly, the cable end portion 28 is then placed atop the snap connector member body 50 in a manner such that the snap tabs 66 extend upwardly through the cable end portion access holes 40 and the alignment pins 64 extend upwardly through the cable end portion alignment holes 38.

As shown in FIG. 3, the tabs 66, the pins 64 and the tabs 68 are then upwardly inserted into the circuit board openings 44,38a and 46, respectively. Finally, the snap connector member body 50 is pressed upwardly toward the circuit board portion 14a in a manner compressing the resilient clamping member 48 and causing the tabs 66 and 68 to outwardly deflect and then snap back to their upright positions causing the barbed upper tab ends 66a,68a to lockingly overlie the top side 20 of the circuit board portion 14a, between its opening pairs 44 and 46, as shown in FIGS. 1 and 3.

This releasably locks the snap connector member 46 to the underside of the printed circuit board 14 and causes the laterally compressed cylindrical elastomeric member 48 to firmly clamp the cable end portion 28 against the underside of the printed circuit board portion 14a. The snap connector member pins 64 serve to precisely align the ribbon cable traces 42 with the circuit board traces 42a (see FIG. 4), and the compressed elastomeric member 48 firmly holds the traces 42,42a against one another along a relatively narrow clamping area extending transversely to the coupled traces 42,42a.

Because of its cylindrical shape, the compressed member 48 desirably creates a relatively concentrated clamping load along this clamping area. With the snap connector member 46 in place on the underside of the printed circuit board portion 14a, the projecting portion 62 of the connector body 50 engages the underside of the ribbon cable end portion 28 and presses it against the underside of the circuit board portion 14a to thereby stabilize the snap connector member and prevent it from pivoting about the top side of the compressed elastomeric member 48.

The connector apparatus of the present invention provides a variety of advantages over conventional zero insertion force and low insertion force connector devices traditionally used to couples ribbon cables to printed circuit boards. For example, the use of the snap connector pins 64 automatically provides a very precise alignment between the cable and board traces 42,42a as described above. Additionally, the possibility of damaging these traces by repeated coupling and uncoupling thereof is essentially eliminated since no friction needs to be exerted on the cable end portion 28 to couple it to the printed circuit board, their is no trace wiping action involved in coupling the end portion 28 to the circuit board, and the end portion is automatically coupled to the circuit board in a parallel relationship therewith instead of transversely thereto, thereby eliminating potential creasing of the cable end portion 28.

Furthermore, it will readily be appreciated that the trace spacing density need not conform to industry standards for conventional zero or low insertion force connectors—the trace spacing density can be lower or higher as desired. Also, a considerable cost savings is achieved in the fabrication of the overall circuit board apparatus since connectors do not have to be soldered to the board to permit ribbon cable attachment thereto.

A variety of modifications could be made to the illustrated embodiment of the connector apparatus 10 if desired. For example, although it is particularly convenient to simply mold the snaps 66,68 and the pins 64 on the connector member 46, these elements could alternatively be formed on or fixedly secured to the circuit board and snap onto and extend through the connector body 50 if desired. Additionally, threaded fasteners could be used in place of this structure to removably secure the body 50 to the circuit board and automatically align the trace sets 42,42a.

The use of the cylindrically shaped elastomeric clamping member 48, as described above, advantageously provides a concentrated clamping load on the facing trace sets 42,42a. However, if desired, the clamping member 48 could be widened and given a rectangular pad-shaped configuration and be used without the stabilizing projection 62 on the snap connector body 50.

It will be appreciated that the snap connector body 50 serves, in conjunction with the clamping member 48, as a separate support structure to operatively and removably hold the trace sets 42,42a in an electrically coupled relationship. As illustrated in FIG. 5, this support structure may be replaced with another support structure in the form of a bottom wall portion 70 of the plastic computer housing 72 in which the printed circuit board 14 is operatively disposed. In this alternative form of the support structure, the groove 60, the stabilizing projection 62, the alignment pins 64, the snap tabs 66, and the snap tabs 68 are simply molded integrally with the wall portion 70 and used in the same manner as their counterparts on the snap connector member 46 to operatively couple the ribbon cable end portion 28 to the printed circuit board 14 positioned above and parallel with the housing wall portion 70.

The foregoing detailed description is to be clearly understood as being given by way of illustration and example only, the spirit and scope of the present invention being limited solely by the appended claims.

What is claimed is:

1. Apparatus for removably coupling an end portion of a flexible ribbon cable having a first spaced series of electrically conductive traces on a side surface thereof to a side surface of a printed circuit board having a second spaced series of electrically conductive traces formed thereon and alignable with said first series of electrically conductive traces, said apparatus comprising:

a support structure having a side surface with an elongated groove formed therein, said groove having a generally semicircular cross-section along its length;

a solid elastomeric member having a generally cylindrical configuration, a first side portion complementarily received in said groove, and a second side portion laterally projecting outwardly beyond said support structure side surface;

attachment means for removably securing said support structure to the printed circuit board in a spaced apart, facing relationship with said side surface thereof, with the ribbon cable end portion being interposed between said elastomeric member and said side surface of the printed circuit board, and said side surfaces of the ribbon cable end portion and the printed circuit board being positioned against one another, in a manner laterally compressing said second side portion of said elastomeric member directly against the ribbon cable end portion, whereby essentially the entire compression force exerted on said elastomeric member is borne by the ribbon cable end portion along a single, relatively narrow area thereof, said groove, when said support structure is operatively secured to the printed circuit board, longitudinally extending generally transversely to said first and second series of electrically conductive traces adjacent the portion of the ribbon cable end portion against which said second side of said elastomeric member is compressed;

an elongated stabilizing portion formed on said support structure side surface and laterally projecting outwardly therefrom, said stabilizing portion being in a laterally spaced, parallel relationship with said groove and being configured to bear against the ribbon cable end portion when said support structure is operatively secured to the printed circuit board;

a spaced first plurality of openings formed through the ribbon cable end portion; and cooperating alignment means associated with the circuit board and said support structure, and extendable through said ribbon cable end portion openings, for maintaining said first and second series of electrically conductive traces in precisely aligned contact with one another at the location of the compressed elastomeric member.

2. The apparatus of claim 1 wherein:

said attachment means are operative to releasably snap-fit said support structure onto the printed circuit board.

3. The apparatus of claim 2 wherein said attachment means include:

a plurality of openings formed through the printed circuit board, and a spaced plurality of resilient snap tab portions formed on said support structure and projecting outwardly therefrom, said snap tab portions being extendable through said circuit board openings and operable to responsively snap into a releasably locked relationship with the printed circuit board.

4. The apparatus of claim 3 wherein:

said attachment means further include a pair of access openings formed in the ribbon cable end portion, and a spaced pair of said plurality of resilient snap tab portions are extendable through said access openings.

5. The apparatus of claim 1 wherein:

said support structure is a molded plastic, generally rectangular connector member, said attachment means include a spaced plurality of openings formed through the printed circuit board, and a spaced plurality of resilient snap tab portions integrally molded with said connector member and projecting outwardly therefrom, said snap tab portion being extendable through said circuit board openings and operative to responsively snap into a releasably locked relationship with the circuit board, and said groove and said stabilizing portion are integrally molded with said connector member.

6. The apparatus of claim 5 wherein said cooperating alignment means include:

a spaced plurality of alignment openings formed in the printed circuit board, and a spaced plurality of alignment pin portions molded integrally with said connector member and projecting outwardly therefrom, said alignment pin portions being insertable through said circuit board alignment openings and said ribbon cable end portion openings.

7. The apparatus of claim 1 wherein:

the printed circuit board is disposed within a computer housing, said support structure is defined by a wall portion of said housing, said attachment means include a plurality of openings formed through the printed circuit board, and a spaced series of resilient snap tab portions formed on said housing wall portion and projecting outwardly therefrom, said snap tab portions being extendable through said circuit board openings and operative to responsively snap into a releasably locked relationship with the printed circuit board, and said groove and said stabilizing portion are formed on said housing wall portion.

8. The apparatus of claim 7 wherein said cooperating alignment means include:

a spaced plurality of alignment openings formed in the printed circuit board, and a spaced plurality of alignment pin portions formed on said housing wall portion and projecting outwardly therefrom, said alignment pin portion being insertable through said circuit board alignment openings and said ribbon cable end portion openings.

9. The apparatus of claim 1 wherein said cooperating alignment means include:

a spaced plurality of alignment openings formed in the printed circuit board, and a spaced pair of alignment members disposed on said support structure and projecting outwardly therefrom, said alignment members being insertable through said circuit board alignment openings and said ribbon cable end portion openings.

10. Circuit board apparatus comprising:

a printed circuit board having a side surface portion along which a spaced series of first electrically conductive traces extend, a spaced plurality of first connection openings, a spaced plurality of second connection openings, and a spaced plurality of alignment openings;

a flexible ribbon cable having an end portion with a side surface positioned against said printed circuit board side surface, said cable end portion having formed thereon a spaced series of second electrically conductive traces aligned with and contacting said first series of electrically conductive traces, said cable end portion further having a spaced plurality of alignment openings disposed therein and in registry with said printed circuit board alignment openings;

a support structure spaced outwardly apart from said ribbon cable end portion in a facing relationship therewith and having:

a body portion having a side surface spaced apart from and facing said ribbon cable end portion, said body portion side surface having an elongated groove formed therein, said groove having a generally semicircular cross-section along its length and longitudinally extending generally transversely to said spaced series of first and second electrically conductive traces, first and second pluralities of outwardly projecting resilient snap tab portions respectively extending through said first and second pluralities of printed circuit board connection openings and releasably locked to said printed circuit board, and a spaced plurality of outwardly projecting alignment pin portions extending through said cable end portion alignment openings and circuit board alignment openings and maintaining a precisely aligned relationship between said series of first and second electrically conductive traces;

a solid elastomeric clamping member having a generally cylindrical configuration, a first side portion complementarily received in said groove, and a second side portion laterally projecting outwardly beyond said body portion side surface and being laterally compressed directly against said ribbon cable end portion, whereby essentially the entire compression force exerted on said elastomeric member is borne by said ribbon cable end portion along a single, relatively narrow area thereof; and an elongated, laterally outwardly projecting stabilizing portion formed on said body portion side surface in a laterally spaced, parallel relationship with said groove, an outer side of said stabilizing portion bearing against said ribbon cable end portion.

11. The circuit board apparatus of claim 10 wherein:
said body portion is formed from a molded plastic material, and
said groove, said stabilizing portion and said first and second pluralities of snap tab portions are molded integrally with said body portion.

12. The circuit board apparatus of claim 10 wherein:
said printed circuit board and said ribbon cable end portion are disposed within a computer housing,
said body portion is defined by a wall portion of said housing portion, and
said groove, said stabilizing portion and said first and second pluralities of snap tab portions are formed on said housing wall portion.

* * * * *